United States Patent
Lim et al.

(10) Patent No.: US 6,953,734 B2
(45) Date of Patent: Oct. 11, 2005

(54) METHOD FOR MANUFACTURING SHALLOW TRENCH ISOLATION IN SEMICONDUCTOR DEVICE

(75) Inventors: Jae-Eun Lim, Ichon-shi (KR); Yong-Sun Sohn, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/735,742

(22) Filed: Dec. 16, 2003

(65) Prior Publication Data

US 2005/0020027 A1 Jan. 27, 2005

(30) Foreign Application Priority Data

Jul. 24, 2003 (KR) .............................. 10-2003-0051086

(51) Int. Cl.⁷ ............................................ H01L 21/76
(52) U.S. Cl. ........................ 438/435; 438/424; 438/437
(58) Field of Search .................... 438/42, 221, 296, 438/359, 424, 435, 437, 775, 776, 777

(56) References Cited

U.S. PATENT DOCUMENTS

| | | | |
|---|---|---|---|
| 4,762,728 A | * 8/1988 | Keyser et al. | 438/437 |
| 4,871,689 A | * 10/1989 | Bergami et al. | 438/427 |
| 5,643,823 A | * 7/1997 | Ho et al. | 438/421 |
| 5,763,315 A | * 6/1998 | Benedict et al. | 438/424 |
| 5,985,735 A | * 11/1999 | Moon et al. | 438/435 |
| 5,989,978 A | * 11/1999 | Peidous | 438/436 |
| 6,153,480 A | * 11/2000 | Arghavani et al. | 438/296 |
| 6,162,700 A | 12/2000 | Hwang et al. | |
| 6,177,333 B1 | 1/2001 | Rhodes | |
| 6,180,467 B1 | * 1/2001 | Wu et al. | 438/296 |
| 6,323,106 B1 | * 11/2001 | Huang et al. | 438/433 |
| 6,498,383 B2 | * 12/2002 | Beyer et al. | 257/510 |
| 6,669,825 B2 | * 12/2003 | Ohmi et al. | 204/192.12 |
| 6,709,951 B2 | * 3/2004 | Beyer et al. | 438/424 |
| 6,727,160 B1 | * 4/2004 | Huang et al. | 438/435 |

OTHER PUBLICATIONS

Stanley Wolf and Tauber N. Richard, Silicon Processing For The VLSI Era, 2000, Lattice Press, Second Edition, pp. 277–283.*

* cited by examiner

Primary Examiner—Michael Lebentritt
Assistant Examiner—Stanetta Isaac
(74) Attorney, Agent, or Firm—Mayer, Brown, Rowe & Maw LLP

(57) ABSTRACT

The method for manufacturing an STI in a semiconductor device with an enhanced gap-fill property and leakage property is disclosed by introducing a nitridation process instead of forming a liner nitride. The method includes steps of: preparing a semiconductor substrate obtained by a predetermined process on which a pad oxide and a pad nitride are formed on predetermined locations thereof; forming an isolation trench with a predetermined depth in the semiconductor substrate; forming a wall oxide on the trench; forming a liner oxide on the wall oxide and an exposed surface of the pad nitride; carrying out a nitridation process for forming a nitrided oxide; forming an insulating layer over the resultant structure, wherein the isolation trench is filled with the insulating layer; and planarizing a top face of the insulating layer.

13 Claims, 6 Drawing Sheets

METHOD FOR MANUFACTURING SHALLOW TRENCH ISOLATION IN SEMICONDUCTOR DEVICE

FIELD OF THE INVENTION

The present invention relates to a method for manufacturing a semiconductor device; and, more particularly, to a method for manufacturing a shallow trench isolation (STI) in a semiconductor device by employing a nitridation process instead of forming a liner nitride.

DESCRIPTION OF THE PRIOR ART

As it is well known, in a semiconductor device, there is formed an isolation region for electrically isolating elements from each other. In order to form the isolation region, various techniques have been employed such as a local oxidation of silicon (LOCOS) which uses a thermal oxide or a shallow trench isolation (STI) technique which is suitable for a highly integrated circuit device.

The LOCOS technique, however, has several drawbacks that a field oxide (FOX) is deteriorated with a decrease of a design rule and further, a bird's beak structure encroached into an active area of the device, thereby reducing the active area. Thus, the LOCOS technique is rarely employed to form the isolation region as the device becomes nano-miniaturized nowadays. In attempt to overcome the disadvantage of the LOCOS technique, the STI technique has been popularly used for a miniaturized device.

Referring to FIG. 1, there is shown a cross sectional view setting forth a conventional STI formed in the semiconductor device.

In FIG. 1, an isolation trench 105 is formed in a predetermined location of a semiconductor substrate 110 and a wall oxide 112, a thermal oxide, is formed on a bottom and sidewalls of the isolation trench 105 by thermally oxidizing a surface of the isolation trench 105. A liner nitride 114 and a liner oxide 116 are formed on the wall oxide 112 in sequence. The isolation trench 105 having a planarized top face thereof is filled with a predetermined insulating material. In the conventional STI, there is introduced the liner nitride 114 for improving a refresh property of the device. The semiconductor device having the conventional STI therein, however, suffers from a drawback that a leakage current may occur due to a punchthrough phenomenon, which is more illustrated in detail as followings.

Referring to FIG. 2, there is a schematic cross sectional view setting forth a pathway of the leakage current along the conventional STI which isolates adjacent pMOSFETs.

In FIG. 2, since hot carriers in the transistor has high energies, the hot carriers may rush out into a gate oxide 120 and further, they are likely to penetrate into the STI through the wall oxide 112. Herein, the hot carriers are mainly electrons which are easily trapped in an interface between the wall oxide 112 and the liner nitride 114. As the design rule gets smaller, the space between the isolation trench 105 decreases, which results in a bad conformality of the wall oxide thickness along an inner surface of the isolation trench 105 because of an oxidation-induced mechanical stress. In detail, the wall oxide thickness in a bottom corner and bottom face of the isolation trench 105 is significantly thinner than the wall thickness in the sidewalls of the isolation trench 105. Thus, the wall oxide 112 has a very thin thickness partially so that the electrons penetrate into the STI and are trapped in the interface due to non-bonding defects existing in the interface. Accordingly, there is happened the punchthrough phenomenon because an inversion layer is formed around the STI because the electrons are trapped in the interface.

In detail, a depletion layer 126 is formed adjacent to a p-type source/drain region 124 by a reverse bias being applied and electron-hole pairs are generated by an impact ionization due to an electric field generated in the depletion layer 126, which results that the electrons exist densely in the interface between the wall oxide 112 and the liner nitride 114. Therefore, inversion holes on an outer surface of the STI move along the STI from one p-type source/drain region 124 to another p-type source/drain region 124, whereby an electrical current (I) is conducted from one to the other. Accordingly, although the STI is formed for isolating each transistor, an adjacent transistor is turned on because of the electrical current (I), thereby increasing an off-state leakage. In particular, as a design rule decreases in manufacturing the semiconductor device nowadays, a width of the STI becomes also narrow so that the punchthrough phenomenon becomes a more serious problem in the miniaturized semiconductor device.

In order to address the above problem, there has been proposed a method for making the wall oxide 112 to be thicker enough to significantly reduce the electric field incurred by the electrons being trapped between the wall oxide 112 and the liner nitride 114. However, this method shows a poor gap-fill property because the width of the isolation trench 105 becomes narrow and narrow as the thickness of the wall oxide 112 increases. Therefore, it induces micro-voids or discontinuities in a gap-fill material filled into the isolation trench 105 so as to deteriorate the device characteristic at last.

To improve the gap-fill property and to prevent the electrons being trapped in the interface, therefore, there is proposed another method employing a nitridation process instead of a process for forming the liner nitride directly on the wall oxide 112. In case of not forming the liner nitride directly on the wall oxide 112, the nitridation process induces the interface with a gradual nitrogen profile between the wall oxide 112 and the nitrided layer, which makes the number of broken bonds for the electron trap marvelously reduced. In addition, an aspect ratio relatively decreases so as to improve the gap-fill property, which is shown in table 1.

TABLE 1

|  | Sample A | | Sample B | | Sample C | |
| --- | --- | --- | --- | --- | --- | --- |
| Wall oxide (Å) | 60 | | 80 | | 100 | |
| Liner nitride (Å) | 50 | 0 | 50 | 0 | 50 | 0 |
| Liner oxide (Å) | 80 | 80 | 80 | 80 | 80 | 80 |
| Aspect ratio | 6.5 | 5.4 | 6.9 | 5.6 | 7.3 | 5.9 |

According to table 1, it is understood that the aspect ratio increases in case of using the liner nitride. Furthermore, as the thickness of the wall oxide increases, the aspect ratio also increases, which results in a poor gap-fill property.

Referring to FIG. 3, there is provided a cross sectional view setting forth a method for manufacturing the STI by employing the nitridation process instead of forming the liner nitride. To begin with, an isolation trench 205 is formed in a predetermined location of a semiconductor substrate 210. Thereafter, a wall oxide 212 is formed over the resultant structure with a predetermined thickness.

In an ensuing step, a nitridation process is carried out so as to nitrify an outer surface of the isolation trench 205, thereby forming a nitrided oxide 214 between the outer surface of the isolation trench 205 and the wall oxide 212. Herein, the nitrided oxide 214 serves as the typical liner nitride for improving a refresh property. Afterward, a predetermined gap-fill material is filled into the trench 205 and is planarized by using a typical planarizing method, thereby obtaining the STI having a planarized top face.

However, during the nitridation process, a portion of the top face of the semiconductor substrate 210 near the isolation trench 205 is also nitrided so that the nitrided oxide 214 is formed on the portion of the top face of the semiconductor substrate 210. As a result, the nitridation on the portion of the top face of the semiconductor substrate 210 prevents a gate oxide 218 being grown up during a post process for forming the gate oxide 218. Accordingly, the gate oxide 218 above the portion of the top face of the semiconductor substrate 210 has relatively a thin thickness in comparison with the other portions of the gate oxide 218, which is called a gate oxide thinning phenomenon. This thin gate oxide 218 may increase the likelihood of dielectric breakdown, which can deteriorate the characteristic of the device formed in the active area. Furthermore, it is difficult to expect a reliable device in the long run.

SUMMARY OF THE INVENTION

It is, therefore, an object of the present invention to provide a method for manufacturing a shallow trench isolation (STI) in a semiconductor device by employing a nitridation process instead of forming a liner nitride, to thereby improve a gap-fill property and to prevent a punch-through phenomenon.

In accordance with one aspect of the present invention, there is provided a method for manufacturing an STI in a semiconductor device, the method including the steps of: a) preparing a semiconductor substrate obtained by a predetermined process on which a pad oxide and a pad nitride are formed on predetermined locations thereof; b) forming an isolation trench with a predetermined depth in the semiconductor substrate; c) forming a wall oxide on the trench; d) forming a liner oxide on the wall oxide and an exposed surface of the pad nitride; e) carrying out a nitridation process for forming a nitrided oxide; f) forming an insulating layer over the resultant structure, wherein the isolation trench is filled with the insulating layer; and g) planarizing a top face of the insulating layer.

In accordance with another aspect of the present invention, there is provided a method for manufacturing an STI in a semiconductor device, the method comprising the steps of: a) preparing a semiconductor substrate obtained by a predetermined process on which a pad oxide and a pad nitride are formed on predetermined locations thereof; b) forming an isolation trench with a predetermined depth in the semiconductor substrate; c) forming a wall oxide on the trench; d) carrying out a nitridation process for forming a nitrided oxide on the wall oxide; e) forming a liner oxide on the nitrided oxide; f) forming an insulating layer over the resultant structure, wherein the isolation trench is filled with the insulating layer; and g) planarizing a top face of the insulating layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 4A to 4D and FIGS. 5A and 5D cross sectional views setting forth a method for manufacturing a shallow trench isolation (STI) in a semiconductor device in accordance with preferred embodiments of the present invention.

Referring to FIGS. 4A to 4D, there are shown cross sectional views setting forth a method for manufacturing the STI in a semiconductor device in accordance with a first preferred embodiment of the present invention.

Figure 1:
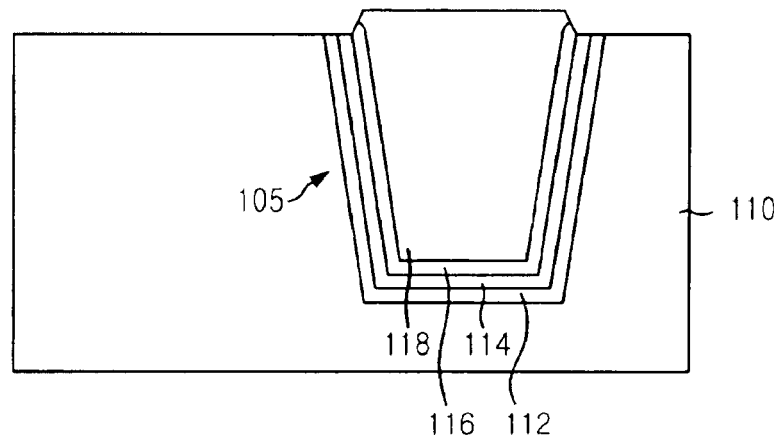
FIG. 1 is a cross sectional views setting forth a conventional shallow trench isolation (STI) for use in a semiconductor device incorporating therein a liner nitride.
Figure 2:
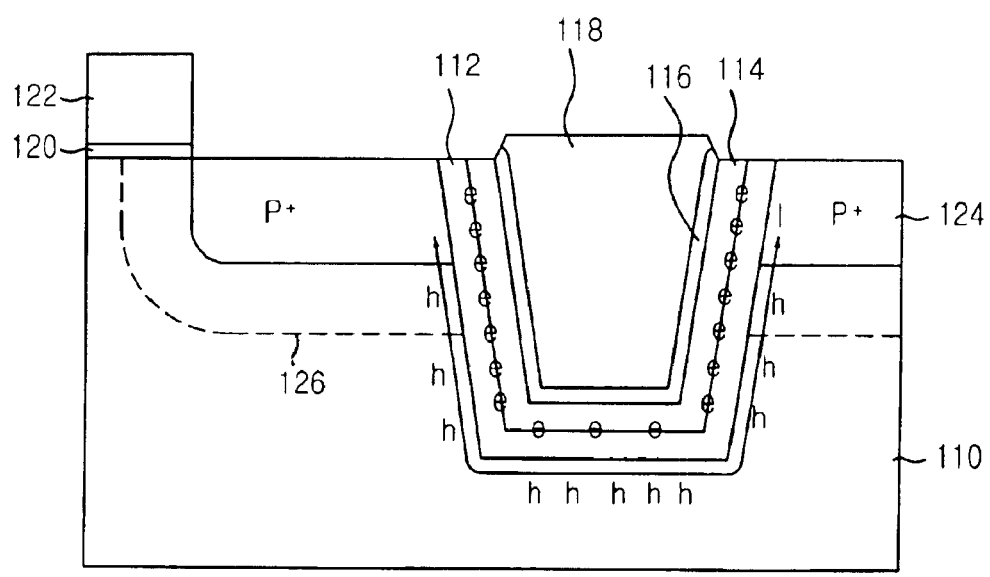
FIG. 2 is a schematic cross sectional view setting forth a leakage current pathway of a conventional STI incorporating therein the liner nitride.
Figure 3:
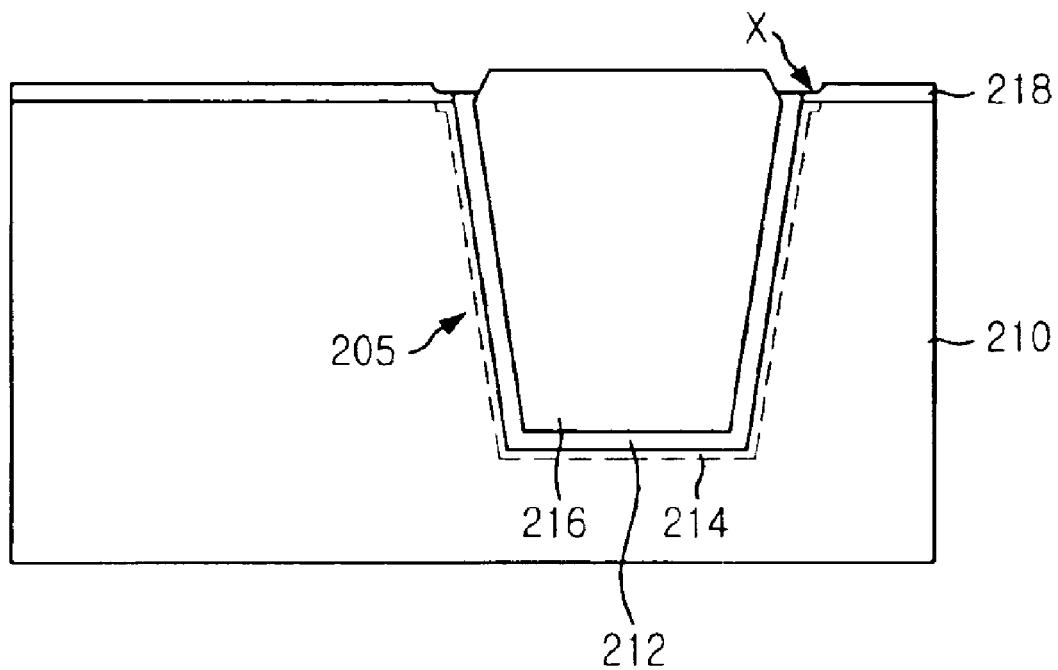
FIG. 3 is a cross sectional view setting forth a conventional method for manufacturing the STI by employing a nitridation process instead of forming the liner nitride.
Figure 4A:
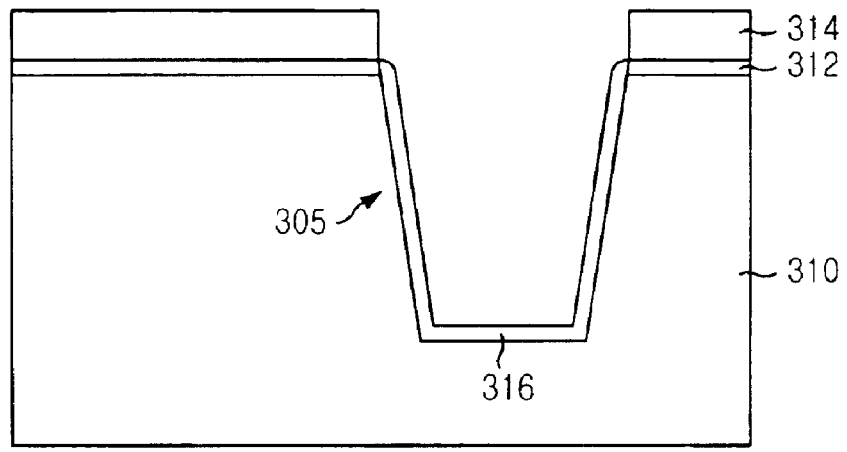
FIGS. 4A to 4D are cross sectional views setting forth a method for manufacturing an STI in a semiconductor device in accordance with a first preferred embodiment of the present invention.

In FIG. 4A, a first inventive method for manufacturing the STI begins with preparing a semiconductor substrate 310 containing impurities therein obtained by a predetermined process. Thereafter, a pad oxide layer and a pad nitride layer are formed on a top face of the semiconductor substrate 310 in sequence. Subsequently, photoresist masks (not shown) are formed on predetermined locations of the top face of the pad nitride layer. Afterward, the pad nitride layer and the pad oxide layer are patterned into a first predetermined configuration by using a typical photolithography process using the photoresist masks, thereby forming a pad oxide 312 and a pad nitride 314. Herein, it is preferable that the pad oxide 312 is formed with a thickness in a range of about 50 Å to about 100 Å and the pad nitride 314 is formed with the thickness in the range of about 500 Å to about 1,000 Å.

Following the formation of the pad nitride 314 and the pad oxide 312, the photoresist masks are removed by using a typical removal method such as a photostrip process. Thereafter, the semiconductor substrate 310 is etched by using a dry etch process employing the pad nitride 314 as an etch mask so as to form an isolation trench 305 with a depth ranging from about 1,000 Å to about 2,500 Å. During the dry etch process, there may be lattice defects of silicon or damage on a surface of the isolation trench 305, which may incur a leakage current. In order to compensate the above damage, a wall oxide 316 is formed on a bottom and sidewalls of the isolation trench 305 with the thickness in the range of about 10 Å to about 135 Å, by thermally oxidizing the surface of the isolation trench 305.

Here, the formation process of the wall oxide 316 should be carried out through a predetermined oxidation process in a manner that an interface trap of hot carriers, i.e., electrons, shall be minimized. For instance, the formation process of the wall oxide 316 is carried out at a temperature in the range of about 850° C. to about 950° C. by using a dry oxidation process on condition that a chlorine (Cl) gas is added into a main gas with amount in the range of about 0.1% to about 10%. On the contrary to the dry oxidation process, a hydrogen termination is conventionally carried out for reducing the interface trap of the hot carriers in a wet oxidation process. In the wet oxidation process, however, there may be the interface trap of the hot carriers because many a hydrogen bond is likely to be broken when an outer electric stress is introduced thereto. Meanwhile, in the present invention, since there is employed the dry oxidation process using Cl gas for forming the wall oxide 316, a plurality of Cl atoms are concentrated in the interface between silicon of semiconductor substrate 310 and the wall oxide 316, thereby providing a strong bond in comparison with the hydrogen bond. It is noted that the thickness of the wall oxide 316 should be determined in consideration of a nitrogen concentration profile during a post nitridation process and a gap-fill margin of an insulting material which will be filled into the isolation trench 305 in a post process.

Figure 4B:
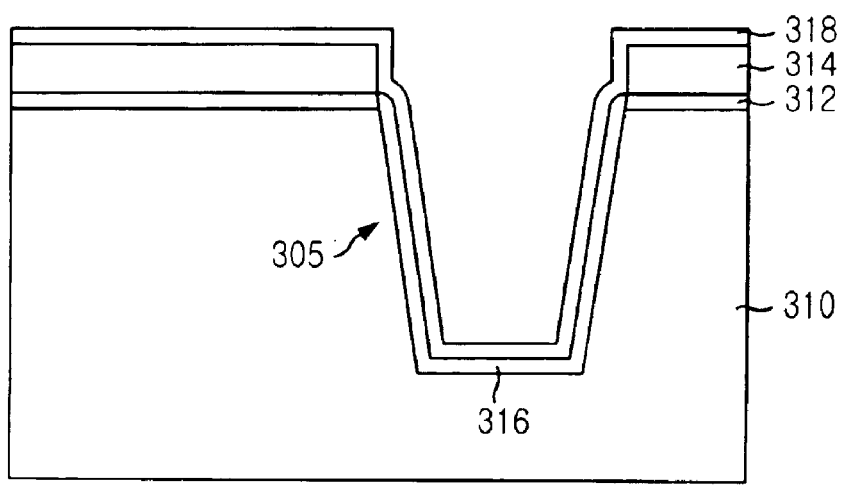

After forming the wall oxide 316, referring to FIG. 4B, a liner oxide 318 is formed on the wall oxide 316 and on an exposed surface of the pad nitride 314 with a predetermined thickness. Typically, the liner oxide 318 plays a role in relieving a mechanical stress experienced during the formation of a liner nitride and preventing a loss of the liner nitride during a process for filling the insulating material into the isolation trench 305. In the present invention, however, the liner oxide 318 plays a role in concentrating nitrogen atoms in the interface between the wall oxide 316 and the liner oxide 318 and also preventing the loss of a nitrided oxide 322 during the post process for filling the insulating material into the isolation trench 305. Herein, the liner oxide 318 is formed by using a method such as a chemical vapor deposition (CVD) or the like. Furthermore, the CVD process is carried out over and over until the liner oxide 318 with a desired thickness can be obtained.

Figure 4C:
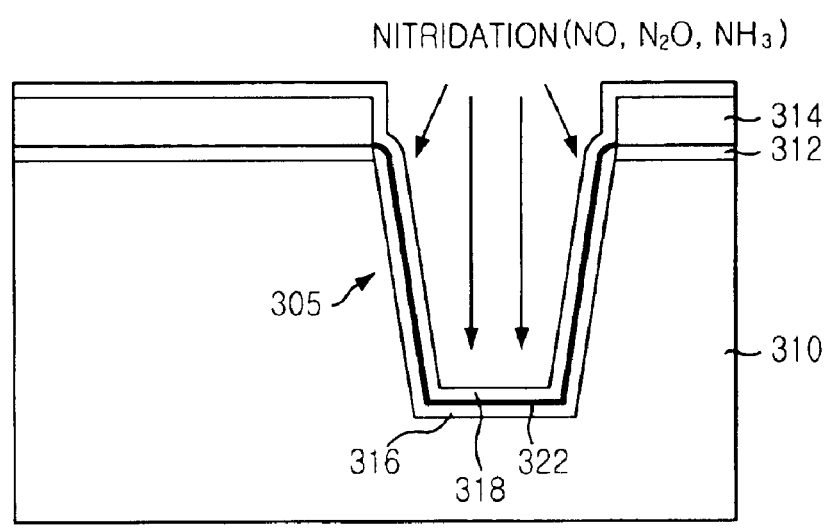
Figure 4D:
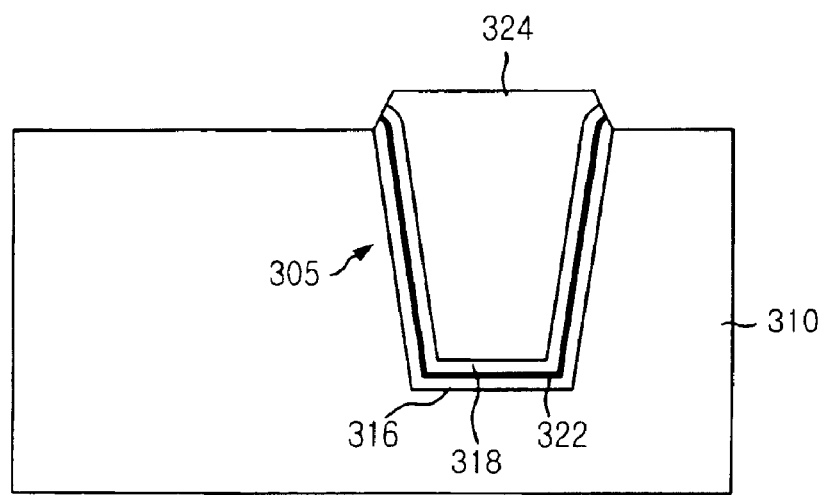

Following the formation of the liner oxide 318, referring to FIG. 4C, a nitridation process is carried out in a annealing furnace or a rapid thermal process (RTP) so as to form a nitrided oxide layer 322 in an interface between the wall oxide 316 and the liner oxide 318. Here, the nitridation process is carried out by using $N_2O$, NO or $NH_3$ in order to obtain a broad nitrogen concentration profile. That is, the nitrogen concentration profile is distributed broadly through the liner oxide 318, the nitrided oxide 322 and the wall oxide 316, which represents a peak point in the nitrided oxide layer 322, and the nitrogen concentration profile slowly decreases far from the nitrided oxide layer 322.

In detail, since there are lots of dangling bonds in the interface between the wall oxide 316 and the liner oxide 318, the nitrogen atoms diffuse into the interface during the nitridation process, thereby forming the nitrided oxide layer 322 between the wall oxide 316 and the liner oxide 318. Thus, the formation of the nitrided oxide layer 322 results in inhibiting nitrogen diffusing into the surface of the isolation trench 305 during the nitridation process so that the nitrogen concentration between the semiconductor substrate 310 and the wall oxide 316 is remarkably decreased.

Despite the formation of the nitrided oxide layer 322, however, small amount of the nitrogen atoms may diffuse into the surface of the isolation trench 305. In this case, it is possible to overcome this problem by means of the formation of a plurality of interfaces on the wall oxide 316, which can be achieved by repeating the deposition process for forming the liner oxide 318. Alternatively, a method for forming the wall oxide 316 thickly or a method for reducing a flow rate of nitrogen containing gas during the nitridation process can be also utilized for addressing this problem.

The more detailed description of the nitridation process in accordance with the first preferred embodiment of the present invention is illustrated as followings.

The nitridation process of the first embodiment is carried out by using NO gas as a source gas at the temperature in the range of about 750° C. to about 850° C. Alternatively, the nitridation process of the first embodiment can be carried out by using $NH_3$ gas as the source gas at the temperature in the range of about 750° C. to about 850° C. or by using $N_2O$ gas as the source gas at the temperature in the range of about 800° C. to about 950° C. Herein, it is noted that the nitridation process should be carried out on condition that a peak concentration of the nitrogen atoms is in the range of about $1 \times E20/cm^3$ to about $1 \times E21/cm^3$. Furthermore, the nitrogen atoms which diffuse into the interface between the semiconductor substrate 310 and the wall oxide 316 should be as small as possible, and the thickness of a gate oxide edge should be reduced to about 20% of a desired thickness of the gate oxide at most.

After carrying out the nitridation process, a predetermined insulating layer 324 such as an HDP oxide, an advanced planarized layer (APL) or a spin on dielectric (SOD), is formed over the resultant structure, wherein the isolation trench 305 is completely filled with the insulating layer 324. Thereafter, the top face of the insulating layer 324 is planarized by using a method such as the CMP. Following the planarization, the pad nitride 314 and the pad oxide 312 are removed, thereby completing the process for manufacturing the STI in the semiconductor device.

In accordance with the first preferred embodiment, the nitrogen atoms diffuse into and are accumulated in the nitrided oxide layer 322 so that nitrogen concentration away from the nitrided oxide layer 322 decreases slowly. Therefore, the nitrogen diffusion into the semiconductor substrate 310 near the isolation trench 305 is rarely happened so that it is possible to secure a desired gate oxide thickness in a post process. In addition, since the liner nitride is not formed in the first embodiment, the electron trap in the interface between the liner nitride and the wall oxide can be effectively prevented. Furthermore, the first embodiment provides a good gap-fill property because the aspect ratio can be decreased in virtue of not forming the liner nitride.

Referring to FIGS. 5A to 5D, there are shown cross sectional views setting forth a method for manufacturing the STI in a semiconductor device in accordance with a second preferred embodiment of the present invention.

Figure 5A:
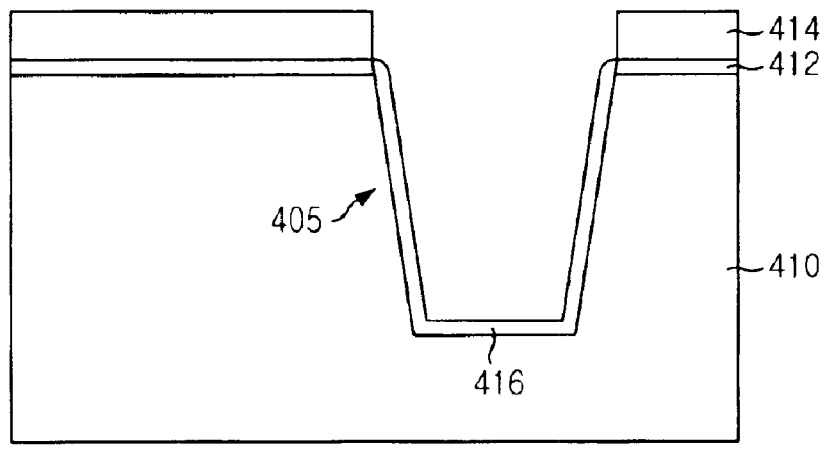
FIGS. 5A to 5D are cross sectional views setting forth a method for manufacturing an STI in a semiconductor device in accordance with a second preferred embodiment of the present invention

In FIG. 5A, a first inventive method for manufacturing the STI begins with preparing a semiconductor substrate 410 containing impurities therein obtained by a predetermined process. Thereafter, a pad oxide layer and a pad nitride layer are formed on a top face of the semiconductor substrate 410 in sequence. Subsequently, photoresist masks (not shown) are formed on predetermined locations of the top face of the pad nitride layer. Afterward, the pad nitride layer and the pad oxide layer are patterned into a first predetermined configuration by using a typical photolithography process using the photoresist masks, thereby forming a pad oxide 412 and a pad nitride 414. Herein, it is preferable that the pad oxide 412 is formed with a thickness in a range of about 50 Å to about 100 Å and the pad nitride 414 is formed with the thickness in the range of about 500 Å to about 1,000 Å.

Following the formation of the pad nitride 414 and the pad oxide 412, the photoresist masks are removed by using a typical removal method such as a photostrip process. Thereafter, the semiconductor substrate 410 is etched by using a dry etch process employing the pad nitride 414 as an etch mask so as to form an isolation trench 405 with a depth ranging from about 1,000 Å to about 2,500 Å. During the dry etch process, there may be lattice defects of silicon or damage on a surface of the isolation trench 405, which may incur a leakage current. In order to compensate the above damage, a wall oxide 416 is formed on a bottom and sidewalls of the isolation trench 405 with the thickness in the range of about 10 Å to about 135 Å, by thermally oxidizing the surface of the isolation trench 405.

Here, the formation process of the wall oxide 416 should be carried out by using a dry oxidation process in a manner that an interface trap of electrons shall be minimized, like the first preferred embodiment.

Figure 5B:
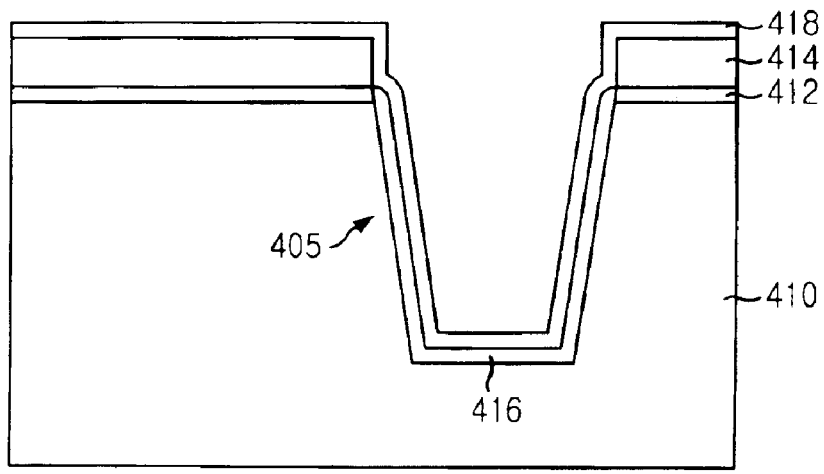

After forming the wall oxide 416, referring to FIG. 5B, a liner oxide 418 is formed on the wall oxide 416 and on an exposed surface of the pad nitride 418 with a predetermined thickness. Herein, the liner oxide 418 is formed by using a method such as a chemical vapor deposition (CVD) or the like. The CVD process is carried out over and over until the liner oxide 418 with a desired thickness can be obtained.

Figure 5C:
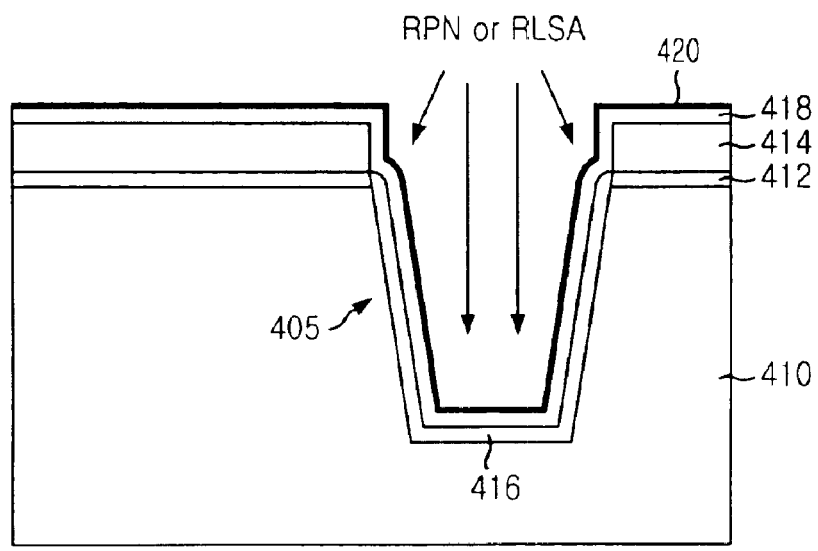
Figure 5D:
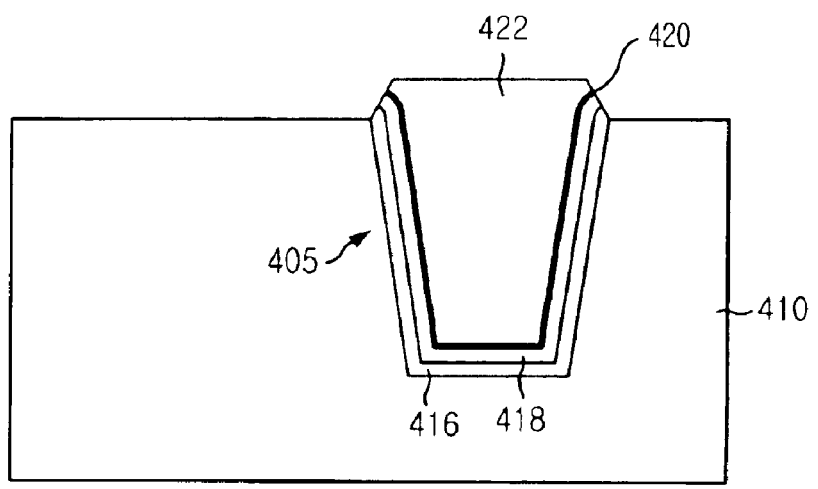

Following the formation of the liner oxide 418, referring to FIG. 5C, a nitridation process is carried out by using a remote plasma nitridation (RPN) process or a radial line slot antenna (RLSA) process so as to form a nitrided oxide 420 on the liner oxide 418. In detail, the surface of the liner oxide 418 with a predetermined depth is partially nitrided during the RPN or RLSA process. For instance, the RPN process for nitridation is carried out by using an $N_2$ gas diluted with helium (He) as a source gas at the temperature in the range of about 550° C. to about 900° C. Meanwhile, the RLSA process for nitridation is carried out by means of plasma using an $N_2$ radical at the temperature in the range of about 150° C. to about 600° C., wherein the source gas includes argon, $N_2$ and $O_2$.

During the RPN or the RLSA process, the nitrided oxide 420 is gradually formed on the liner oxide 418 by converting the surface with the predetermined depth of the liner oxide into the nitrided oxide 420 so that there is rarely happened the electron trap between the nitrided oxide 420 and the liner oxide 418. In the second embodiment, since the nitridation process is performed by using a plasma technique, i.e., the RPN or the RLSA, the nitrogen concentration profile through the nitrided layer 420 becomes more narrow and steeper than the profile resulted from the first embodiment. Accordingly, the wall oxide 416 can be formed thinner in comparison with the first embodiment, thereby enhancing a gap-fill property because of reducing the gap aspect ratio. Furthermore, the nitrogen content exists densely in the nitrided oxide 420 and rarely exist in the liner oxide 418 and the wall oxide 416 so that the nitrogen diffusion into the semiconductor substrate 410 can hardly occur. Accordingly, it is possible to secure a desired gate oxide thickness when the gate oxide will be formed on the semiconductor substrate 410. That is, it is possible to avoid a gate oxide thinning phenomenon.

After carrying out the nitridation process, a predetermined insulating layer 422 such as an HDP oxide, an APL or an SOD, is formed over the resultant structure, wherein the isolation trench 405 is completely filled with the insulating layer 422. Thereafter, the top face of the insulating layer 422 is planarized by using a method such as the CMP. Following the planarization, the pad nitride 414 and the pad oxide 412 are removed, thereby completing the process for manufacturing the STI.

In the second embodiment, the nitridation process is carried out after the formation of the liner oxide 418. However, in case of not requiring a highly integrated semiconductor device, the wall oxide 416 can be increased enough to prevent the nitrogen atoms diffusing into the surface of the isolation trench 405. In this case, it is possible to carry out the RPN or RLSA process directly after the formation of the thick wall oxide 416 so that the nitrided oxide 420 is formed directly on the thick wall oxide 416. Thus, the liner oxide 418 is formed after carrying out the nitridation process.

As aforementioned, in accordance with the second preferred embodiment, the nitrided oxide 420 is formed on the liner oxide 418 or directly on the wall oxide 416 by using the RPN or the RLSA process. Namely, the nitrogen concentration profile is mainly distributed in the nitrided oxide 420 and is rarely distributed in the liner oxide 418 and the wall oxide 416, thereby obtaining a narrow and a steep concentration profile. Therefore, the thickness of the wall oxide 416 can be reduced because the thinner wall oxide can sufficiently prevent the nitrogen diffusing into the semiconductor substrate 410 near the isolation trench 405, which secure a good gap-fill property.

As described above, the present invention employs the nitridation process instead of forming the liner nitride directly on the wall oxide. Accordingly, there is no interface having dangling bonds between the liner nitride and the wall oxide so that it is possible to prevent the electron being trapped in the interface. Furthermore, since the nitrogen concentration profile is distributed like a normal distribution curve where the peak point exists in the nitrided oxide, there is hardly distributed nitrogen content far from the peak point. Therefore, it is possible to secure the desired gate oxide thickness without generating a gate thinning phenomenon.

While the present invention has been described with respect to the particular embodiments, it will be apparent to those skilled in the art that various changes and modifications may be made without departing from the scope of the invention as defined in the following claims.

What is claimed is:

1. A method for manufacturing a shallow trench isolation (STI) in a semiconductor device, the method comprising the steps of:
   a) preparing a semiconductor substrate obtained by a predetermined process on which a pad oxide and a pad nitride are formed on predetermined locations thereof;
   b) forming an isolation trench with a predetermined depth in the semiconductor substrate;
   c) forming a wall oxide on the trench;
   d) forming a liner oxide on the wall oxide and an exposed surface of the pad nitride;
   e) carrying out a nitridation process for forming a nitrided oxide;
   f) forming an insulating layer over the resultant structure, wherein the isolation trench is filled with the insulating layer; and
   g) planarizing a top face of the insulating layer,
   wherein the step e) is carried out in an annealing furnace or a rapid thermal process (RTP) by using a nitrogen-containing gas selected from the group consisting of $N_2O$, NO and $NH_3$, thereby forming the nitrided oxide between the liner oxide and the wall oxide.

2. The method as recited in claim 1, wherein the step e) is carried out by using NO gas as a source gas at a temperature in a range of about 750° C. to about 850° C.

3. The method as recited in claim 1, wherein the step e) is carried out by using $NH_3$ gas as a source gas at a temperature in a range of about 750° C. to about 850° C.

4. The method as recited in claim 1, wherein the step e) is carried out by using $N_2O$ gas as a source gas at a temperature in a range of about 800° C. to about 950° C.

5. The method as recited in claim 1, wherein the step d) is carried out by repeating a chemical vapor deposition (CVD) process for forming a plurality of interfaces on the wall oxide.

6. The method as recited in claim 1, wherein the step c) is carried out by using dry oxidation process on condition that a process temperature is in the range of about 850° C. to about 950° C. and a chlorine gas is supplied with amount in the range of about 0.1% to about 10%.

7. The method as recited in claim 1, wherein the step f) is carried out by using a material selected from the group consisting of a high density plasma (HDP) oxide, an advanced planarized layer (APL) and a spin on dielectric (SOD).

8. A method for manufacturing an STI in a semiconductor device, the method comprising the steps of:

a) preparing a semiconductor substrate obtained by a predetermined process on which a pad oxide and a pad nitride are formed on predetermined locations thereof;

b) forming an isolation trench with a predetermined depth in the semiconductor substrate;

c) forming a wall oxide on the trench;

d) carrying out a nitridation process for forming a nitrided oxide on the wall oxide;

e) forming a liner oxide on the nitrided oxide;

f) forming an insulating layer over the resultant structure, wherein the isolation trench is filled with the insulating layer; and g) planarizing a top face of the insulating layer, wherein the step d) is carried out in an annealing furnace or a rapid thermal process (RTP) by using a nitrogen-containing gas selected from the group consisting of $N_2O$, NO and $NH_3$.

9. The method as recited in claim 8, wherein the step c) is carried out by using dry oxidation process on condition that a process temperature is in the range of about 850° C. to about 950° C. and a chlorine gas is supplied with amount in the range of about 0.1% to about 10%.

10. The method as recited in claim 8, wherein the step f) is carried out by using a material selected from the group consisting of an HDP oxide, an APL and an SOD.

11. The method as recited in claim 8, wherein the step d) is carried out by using NO gas as a source gas at a temperature in a range of about 750° C. to about 850° C.

12. The method as recited in claim 8, wherein the step d) is carried out by using $NH_3$ gas as a source gas at a temperature in a range of about 750° C. to about 850° C.

13. The method as recited in claim 8, wherein the step d) is carried out by using $N_2O$ gas as a source gas at a temperature in a range of about 800° C. to about 950° C.

* * * * *